United States Patent [19]

Shirahata et al.

[11] Patent Number: 4,791,239
[45] Date of Patent: Dec. 13, 1988

[54] MULTILAYER PRINTED WIRING BOARD AND METHOD FOR PRODUCING THE SAME

[75] Inventors: Isao Shirahata, Chigasaki; Shoji Shiga, Utsunomiya; Hisako Hori, Tokyo; Takamasa Jinbo, Odawara, all of Japan

[73] Assignee: Furukawa Denki Kogyo Kabushiki Kaisha, Tokyo, Japan

[21] Appl. No.: 55,706

[22] Filed: May 29, 1987

[30] Foreign Application Priority Data

May 30, 1986 [JP] Japan ............................. 61-125118

[51] Int. Cl.$^4$ ............................................. H05K 1/00
[52] U.S. Cl. ..................................... 174/68.5; 361/414
[58] Field of Search ........................................ 174/68.5

[56] References Cited

U.S. PATENT DOCUMENTS

| | | | |
|---|---|---|---|
| 4,371,744 | 2/1983 | Badet et al. | 174/68.5 |
| 4,417,393 | 11/1983 | Becker | 174/68.5 X |
| 4,490,429 | 12/1984 | Tosaki et al. | 174/68.5 X |
| 4,529,835 | 7/1985 | Mizuno | 174/68.5 |
| 4,604,496 | 8/1986 | Ishihara et al. | 174/68.5 |

FOREIGN PATENT DOCUMENTS 61-125118  5/1986  Japan .
  279195  12/1986  Japan .

OTHER PUBLICATIONS

Haddad, M. C.; Metallizing Multilayer Ceramic Top and Bottom Side; IBM Technical Disclosure Bulletin; vol. 16, No. 11; Apr. 1974; p. 3612.

*Primary Examiner*—Morris H. Nimmo
*Attorney, Agent, or Firm*—Michael N. Meller

[57] ABSTRACT

A multilayer printed wiring board produced by the buildup process. A first layer printed wiring pattern (13) is formed on a metal core (11) through a first insulation laminate (12), and a second layer printed wiring pattern (16) is formed on the first layer printed wiring pattern through through studs (15) and a second insulation laminate (14). The surface of the first layer printed wiring pattern (13) is roughened and the through studs (15) are formed by the buildup process using a conductive paste on the roughened surface.

19 Claims, 3 Drawing Sheets

MULTILAYER PRINTED WIRING BOARD AND METHOD FOR PRODUCING THE SAME

BACKGROUND OF THE INVENTION

1. Field of the Invention

The present invention relates to a multilayer printed wiring board for use with electronic devices, components, etc., and more particularly to a multilayer printed wiring board which has a high density and excellent heat dissipating properties.

2. Description of the Prior Art

In parallel with an increasing tendency toward the miniaturization of devices and advancement in the electronic industry, there has been an ever increasing trend aiming at the production of printed wiring boards which permit high-density mounting. Also, there has been a tendency toward forming both a power supply circit and signal circuits on a single printed wiring board (PWB) and further there has been a demand for high-density mounting and improved heat dissipating properties.

In the past, as a PWB capable of ensuring high-density mounting, a multilayer printed wiring board has been used widely in which a plurality of double-sided copper-clad glass epoxy resin boards, each formed with a printed wiring pattern on its laminated copper foil by the subtractive process, are laminated and the necessary conductive paths are provided by plated through-holes. However, the resin boards are made of resins which are inferior in heat conductivity and thick resulting in deterioration of the heat dissipating properties.

Thus, while ceramic multilayer wiring boards utilizing thick film printing have been used widely, they have the disadvantages that they are more expensive, tend to be damaged by mechanical stresses and have limitations in size.

Further while metal cored substrates utilizing good heat dissipating properties of metals have been used in the fields requiring heat dissipating properties, they must have multilayer structures in order to attain the desired high-density mounting. One method (I) to produce a multilayer structure is the use of plated through-holes. More specifically, as shown in FIGS. 2a to 2c, the method comprises laminating a copper foil 23 through an insulation laminate 22 to each side of an aluminum substrate 20 formed with through-holes 21 preliminarily (FIGS. 2a and 2b), forming through-holes 24 in the portions of the copper foils 23 corresponding to the through-holes 21 (FIG. 2c), and forming a plated copper layer on the insides of the through-holes by an electrodeless plating process or an electroplating process.

Another method (II) comprises, as shown in FIG. 3, bonding a metal foil, e.g., copper foil, to one side of a metal substrate 31 through an insulation laminate 32 and removing the unwanted portions of the copper foil by the subtractive process to form a first layer printed wiring pattern 33 of the desired design, and forming interlaminar conductors (hereinafter referred to as through studs), interlaminar insulation laminates and a second layer printed wiring pattern by the use of an insulating material and a conductive paste.

More specifically, as shown in FIG. 3, a through stud 35 made of a cured conductive paste is formed at each of the desired positions on the first layer printed wiring pattern 33 on the insulation laminate 32, and a second layer printed wiring pattern 36 is printed with a conductive paste and cured through interlaminar insulation laminates 34-1 and 34-2.

Then, in order to meet the need for a multilayer printed wiring board which is excellent in heat dissipating properties and low in cost, it is desirable to use a substrate combining the heat conductivity of a metal and the economy and electric insulating properties of a resin. However, of the previously mentioned methods of producing multilayer printed wiring boards of the type employing a metal cored substrate, the previously mentioned method (I) employing the plated through-holes is not suitable for the production of a high-density multilayer printed wiring board which attaches importance to the heat dissipating properties, since the essential aim of using the substrate for its excellent heat dissipating properties is ruined by the presence of the insulation laminates on its sides.

On the other hand, the method (II) employing the conductive paste layers and the insulation laminates is disadvantageous in that the conductivity of the cured conductive paste is low and there is a limitation to the allowable current.

To improve on this point, a method has been proposed in which a metal plating, e.g., copper plating (37 in FIG. 3), is additionally applied onto the cured conductive paste on the top layer printed wiring pattern. However, this method is also disadvantageous in that while the conductivity is increased greatly, a temperature rise due to the flow of a large current is so large that there is a limitation to the allowable current carrying capacity. Such temperature rise is a problem which is mainly concerned with the through studs.

SUMMARY OF THE INVENTION

With a view to overcoming the foregoing deficiencies in the prior art, it is the primary object of the present invention to provide a multilayer printed wiring board in which conductor paths or through studs between the respective layer printed wiring patterns are high in reliability and excellent in heat dissipating properties and ensure high-density mounting.

In accordance with the invention, there is thus provided a multilayer printed wiring board including a metal core made of aluminum, iron, copper or the like, an insulation laminate disposed on the metal core and at least two layers of printed wiring patterns laminated to the insulation laminate through another insulation laminate. Particularly, the first layer printed wiring pattern closer to the metal core is a metal layer whose surface on the second layer printed wiring pattern side is formed into a rough surface such that the average value of the differences in height between its peaks and valleys is 1 $\mu$m or more and the second layer printed wiring pattern and through studs between the printed wiring patterns are made of a cured conductive paste.

A method for producing such multilayer printed wiring board comprises the steps of forming a first layer printed wiring pattern by the subtractive process on a metal foil layer of a metal-clad insulating metal cored substrate made by bonding together, through an insulation laminate, a metal foil formed at least on one side thereof with a rough surface whose average value of the differences in height between its peaks and valleys is 1 $\mu$m or more and a metal core, with the rough surface serving as a nonbonding surface, forming a plurality of through studs made of cured resin-type conductive paste to provide conduction between the first layer printed wiring pattern and a second layer printed wiring pattern to be formed next and a second insulation laminate for providing insulation spaces of the first layer printed wiring pattern and insulation between the first and second printed wiring patterns, and forming the second layer printed wiring pattern by screen printing a desired pattern on the surface of the through studs and the second insulation laminate by the use of a resin-type conductive paste, curing the paste and applying an electrodeless plating onto the cured paste.

In accordance with the invention, by virtue of the fact that the through studs made of the cured resin-type conductive paste are provided on the roughened surface of the first layer printed wiring pattern to ensure a satisfactory contact between the conductive metal powder in the paste and the first layer printed wiring pattern, the generation of heat is decreased and the allowable current value is increased, thereby fully ensuring the effects of the use of the metal core, which has excellent heat dissipating properties.

The above and other objects, features and advantages of the invention will become more apparent from the following detailed description taken in conjunction with the drawings.

BRIEF DESCRIPTION OF THE DRAWINGS

FIGS. 4a to 4h are sectional views for explaining the method for producing the two-layer printed wiring board according to the embodiment of the invention.

DESCRIPTION OF THE PREFERRED EMBODIMENTS

An embodiment of the invention which is applied to the production of a two-layer printed wiring board will now be described with reference to FIGS. 4a to 4h.

Figure 1:
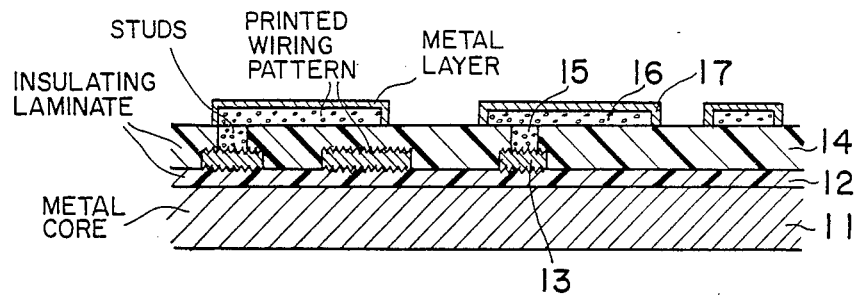
FIG. 1 is a sectional view for explaining the construction of a two-layer printed wiring board according to an embodiment of the invention.
Figure 2A:
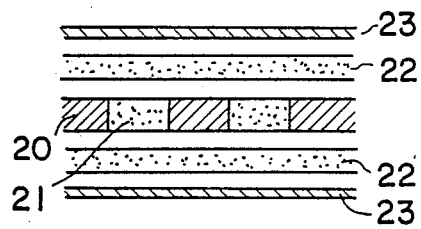
FIGS. 2a to 2c and FIG. 3 are sectional views useful for explaining conventional two-layer printed wiring board production methods.
Figure 2B:
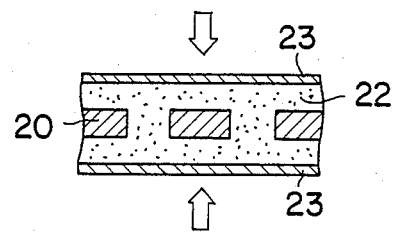
Figure 2C:
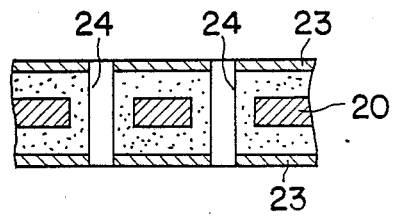
Figure 3:
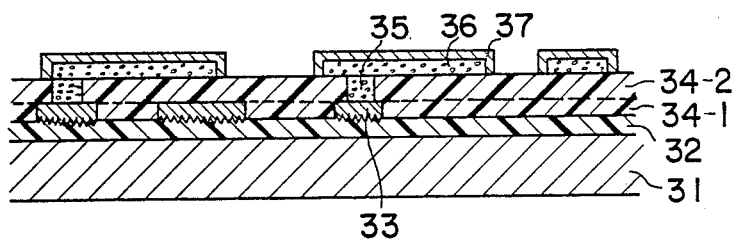
Figure 4A:
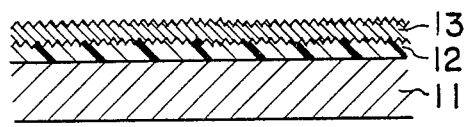

In FIGS. 4a to 4h a metal core 11 and a metal foil 13 are bonded together under the application of heat and pressure through an insulation laminate 12 having good adhesive properties to obtain a metal foil clad-insulated metal cored substrate (FIG. 4a). While such materials as aluminum, copper, iron and their alloys may be used as materials for the metal core, aluminum and its alloys, which are relatively low in cost, excellent in heat conductivity and require no corrosion resisting treatment and the like, are preferable materials. Also, these materials may be used in the form coated with an oxide layer on the surface thereof.

The insulation laminate must possess adhesive properties for bonding the metal core and the metal foil together and electrical insulating properties and a composite material mainly composed of a resin and an inorganic material is preferred. Suitable resins may include, for example, epoxy, phenol, polyamide-imide, polyimide, nitrile-rubber modified phenol, butyral modified phenol resin, etc., and the inorganic material used for the purpose of providing the desired molding properties and educing the thermal coefficient in addition to the heat conductivity may be composed of glass cloth or powdered talc, quartz, alumina, titania or the like. Such an insulation laminate is preliminarily applied and dried on either or both of the metal core and the metal foil and then the bonding is effected. If necessary from the characteristic point view, it is effective to apply a different one or ones onto it. The thickness of the insulation laminate 12 should preferably be between 0.03 and 0.1 mm in dependence on the desired electrical insulation and heat conductivity.

Copper and aluminum foils of good conductivity may be used for the metal foil and particularly the copper foil having good working properties is suited for the purpose. While it is conceivable to use a method of effecting the bonding by employing a metal foil whose surface on the second layer pattern side is preliminarily roughened in such a manner that the average value of the differences in height between its peaks and valleys is 1 $\mu$m or more and another method of roughening the surface of the metal foil after the bonding operation, it is preferable to use a preliminarily roughened foil since the roughening after the formation of a pattern deteriorates the dimensional accuracy of the wiring and since it is difficult to uniformly roughen the surface of the pattern.

While any of such chemical methods as chemical etching, electrochemical solution and electrodeposition and such physical methods as honing and sandblasting may be used as the method of roughening the surface of the metal foil, the method of electrodeposition is preferred from the productivity point of view. The roughness of the roughened surface is given in terms of the average value of the differences in height between its peaks and valleys corresponding to the 10-point average roughness according to the JIS Specification B601 and its value must be 1 $\mu$m or more, and preferably in the range between 2 $\mu$m and 6 $\mu$m. The roughened surface roughness of less than 1 $\mu$m results in an unsatisfactory contact between the roughened surface of the first layer printed wiring pattern of the metal foil and the metal particles in the conductive paste, thus failing to increase the current carrying capacity. On the other hand, any unnecessarily large surface roughness is not preferred since there is the danger of deteriorating the dielectric strength of the insulation laminate, although the current carrying capacity can be increased.

Figure 4B:
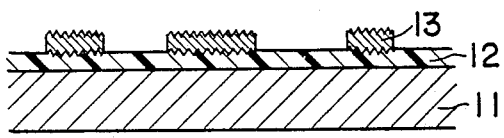

Then, the undesired portions of the metal foil are removed by etching in accordance with the conventional method so as to form a first layer printed wiring pattern 13 as shown in FIG. 4b.

Figure 4C:
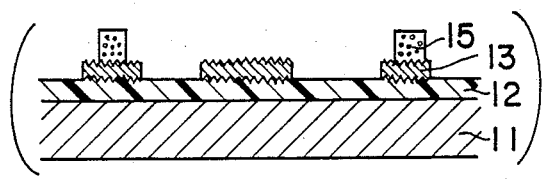
Figure 4D:
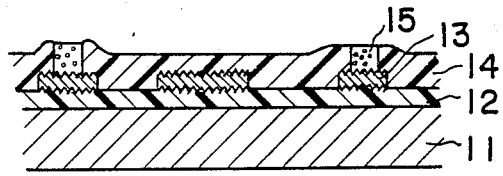

Then, as shown in FIG. 4d, a conductive paste is cured to provide through studs 15 forming conductive paths between the first-layer and second-layer printed wiring patterns and also an insulation laminate 14 made of an insulating material is provided for insulation between the portions of the first layer printed wiring pattern and between the two printed wiring patterns. The conductive paste may be such that it has a specific resistance between $1 \times 10^{-5}$ $\Omega$cm and $1 \times 10^{-3}$ $\Omega$cm after curing. The conductive metal powder contained in the paste may be silver, copper, silver-plated copper, silver-plated nickel or the like and copper powder is well suited from the cost point of view. In particular, it is preferable to use a resin-type copper paste employing spherical copper powder having holes therein. This type of paste is well suited, because forming the copper powder into particularly a spherical or granular shape has the effect of remarkably improving the printing performance and moreover the presence of holes inside the copper powder has the effect of decreasing the specific gravity of the copper powder to prevent the copper powder from sinking in the paste and achieving the desired porosity that satisfactorily ensures the probability of contact between the copper particles in the cured paste with a relatively small loading weight (as compared with spherical powder having no holes), thereby ensuring stable high conductivity.

In addition to the composite material compositions described by way of examples in connection with the insulation laminate 12, such resins as ultraviolet-curing resins, e.g., acrylic resins and such inorganic materials as clays, barium sulfate and calcium carbonate may be used as insulating materials for forming such insulation laminate.

Where necessary from the characteristic point of view, the use of a laminate of different composite materials is effective.

It is to be noted that while there is no predetermined order in which through studs and an insulation laminate are formed, where an insulation laminate is formed by screen printing and curing a thermosetting-type insulating paste, the formation of through studs should preferably be effected as shown in FIG. 4c. The reason is that if the screen printing of the insulating paste is effected first, there is the danger of the insulating paste bleeding over the first layer printed wiring pattern of the metal foil and forming a thin insulating film, thereby deteriorating the reliability in conduction between the first layer printed wiring pattern and the through studs. However, this does not apply to a case where a UV curing development-type insulating paste, dry film or the like having a good resolution is used.

Figure 4E:
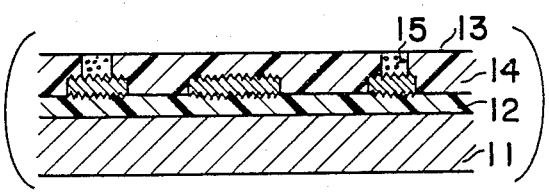
Figure 4F:
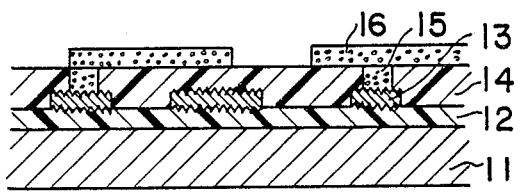

Then, as shown in FIG. 4f, a second layer printed wiring pattern is formed by a buildup process and curing a conductive paste. In this case, it is desirable to preliminarily make the lower layer surface as flat as possible by mechanical grinding as shown in FIG. 4e. The reason is that the printing accuracy of the conductive paste is enhanced with a decrease in the irregularities on the undercoat. Also, where the surface of the through studs is completely covered with an insulating material, the through stud surface on the second printed wiring pattern side can be fully exposed by grinding. In addition, the compositions mentioned in connection with the description of the through studs can be used for the conductive paste and similarly a resin-type conductive paste employing spherical copper powder having holes is well suited. Further, a printed wiring pattern formed by the use of this conductive paste can be used advantageously as a chemically plated undercoat pattern. In other words, generally the amount of conductive metal powder in a resin-type conductive paste shows a loading weight representing a minimum specific resistance. Thus, in the past, where an electrodeless plating is applied to the surface of a printed wiring pattern formed with a conductive paste so as to impart a high degree of conductivity, a paste filled with more conductive metal powder than the loading weight representing the minimum specific resistance is used and the metal is exposed considerably to the surface of the pattern formed with the conductive paste.

In the case of the resin-type conductive paste employing spherical copper powder having holes, the copper powder is not easily caused to sink due to the presence of the holes therein and moreover their spherical shape tends to facilitate the exposure of the heads of the individual copper particles. Thus, without increasing the copper powder loading weight, it is possible to provide a uniform plated wiring pattern with a high deposition rate and high plate adhesion to the conductor surface.

Figure 4G:
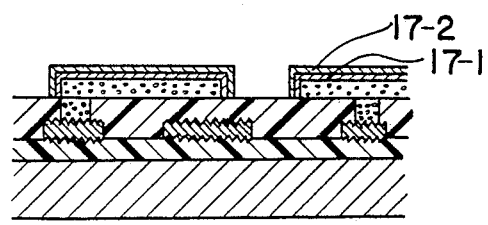

Then, as shown in FIG. 4g, a metal layer 17 is formed on the second layer printed wiring pattern 16 by electrodeless plating. This operation is performed for the reason that the conductivity of the conductive pase is low as compared with the metal, thus limiting the allowable current of the resulting wiring pattern, and the operation may be eliminated if the required current is low. In addition, there is no particular limitation to the method and type of the electrodeless plating. While the electrodeless plating of gold, silver, copper, nickel or the like is applicable, a method of applying a nickel-boron alloy electrodeless plating 17-1 and then applying an electrodeless copper plating 17-2 to form a printed wiring pattern is excellent in solderability and free from the occurrence of any soldering erosion. Also, it is to desirable perform a treatment, such as mechanical grinding, solvent treating or chemical treating as a preliminarily treatment for the electrodeless plating.

The following are specific examples of the actual production of multilayer printed wiring boards according to the present invention.

EXAMPLE 1

After the surface of an aluminum plate which was 1.5 mm thick and 500 mm square had been activated by alkali etching, a copper foil (35 $\mu$m thick) having one side (referred to as the M side) roughened to a 10 point average roughness of 8 $\mu$m according to the JIS Specification B0601 and the other side (referred to as the S side) roughened to 3.2 $\mu$m was bonded with the M side serving as a bonding surface to the aluminum plate under the application of heat 170° C. and pressure of 50 kg/cm$^2$ through an insulation laminate formed by applying and curing a resin composition including alumina 50% (weight %, the same applies hereinafter) and polyamide-imide resin 50% to a thickness of 50 $\mu$m and an epoxy resin composition containing silica 50%, thereby preparing a copper-clad aluminum plate. Then, a piece was cut from the resulting copper-clad aluminum plate to a size of 100 mm long and 150 mm wide and then in accordance with the conventional method a resist was formed with a dry film and etched by a ferric chloride solution, thereby forming a first layer printed wiring pattern. Note that the M and S sides were roughened by an electrochemical deposition process.

Then, using a resin-type copper paste prepared by mixing 85% of spherical copper powder having holes and an average particle size of 10.8 $\mu$m, 15% of resol-type phenol resin (nonvolatile content) and a small amount of oleic acid with a solvent consisting of ethyl Carbitol, a through stud of 1.0 mm in diameter and 0.03 mm in height was formed at each of given portions by the buildup process and cured at 180° C. for 30 minutes.

Note that the spherical copper powder with holes was produced by the following method. Molten copper of 1700° C. was sprayed under a pressure of 1 kg/cm$^2$ against a water bed turning along with a drum within a rotary drum and a high-pressure nitrogen gas of 20 kg/cm$^2$ was sprayed against the molten copper from the oblique side to effect a primary atomization of it. Then, the molten copper was impinged on the water bed to effect a secondary atomization, collected from the water, dried, placed in a hydrogen gas of 250° C. for 30 minutes so as to reduce its surface oxidation and classified by a classifier, thereby obtaining spherical copper powder having the maximum particle size of 50 $\mu$m and the average particle size of 10.8 μm. The porosity was 10.5% and the apparent density was 3.52 g/cm³.

Then, an insulating paste of an epoxy resin containing 30% of silica was printed by the screen printing process over the surface, excluding the through stud portions, and cured at a temperature of 150° C. for 30 minutes.

Then, the surface of the assembly was ground by the use of a three-reel scrub grinder having three buffing rolls #600, #600 and #800.

Then, a resin-type copper paste of the previously mentioned type was used to print a second layer printed wiring pattern by the buildup process and similarly cured at 180° C. for 30 minutes, thereby forming a printed wiring pattern layer of about 20 μm.

Then, after the printed wiring board had been immersed in 10% HCl for 10 minutes to clean its surface, the printed wiring board was immersed in an electrodeless nickel plating bath (NICRAD-741: Okuno Chemical Ind. Co., Ltd.) (65° C., pH7.1) for 15 minutes, thereby applying an NiB (B content was about 0.9%) plating about 3.5 μm thick. Then, the printed wiring board was immersed in an electrodeless copper plating bath (ELC-HS; Uemura Kogyosha K.K.) (65° C.) for 2 hours to apply a copper plating about 8 μm thick.

EXAMPLE 2

A multilayer printed wiring board according to the invention was produced in the same manner as in Example 1 except that a copper-clad aluminum plate was formed by using a copper foil (35 μm) having the same M side as in Example 1 and a smooth S side and then the 10-point average roughness of the S side was made to be 1.1 μm by the sandblasting treatment.

EXAMPLE 3

After the surface of an aluminum plate had been coated with an oxide film 6 μm thick by anodic oxidation, a copper foil 35 μm thick having the M side roughened to 8 μm (average roughness of JIS-B0601) and the S side roughened to 4.5 μm was bonded with the M side serving as a bonding surface to the aluminum plate under the application of heat and pressure through an insulation laminate formed by coating and curing an epoxy resin composition including alumina 65 weight % to a thickness of about 70 μm, thereby preparing a copper-clad aluminum plate of 250 mm×250 mm square. Then, a first layer printed wiring pattern was formed in the same manner as in Example 1.

Then, using a resin-type copper paste prepared in the same manner as in Example 1 using spherical copper powder of an average particle size of 2.7 μm, a through stud of 1.0 mm in diameter and 0.03 mm in height was formed at each of given portion on the pattern by the buildup process and cured at 150° C. for 30 minutes.

Then, an insulating resin paste of an epoxy resin containing 30% of silica was printed by the buildup process over the surface, excluding the through stud portions, and cured at a temperature of 150° C. for 30 minutes.

Then, after the surface of the assembly was ground by the use of an abrasive paper, a second layer printed wiring pattern was formed by the buildup process using the resin-type copper paste of the same type as of Example 1 and cured at 180° C. for 30 minutes, thereby forming a printed wiring pattern layer about 20 μm thick. After that, the NiB plating was applied to the layer in the same manner as in Example 1.

Comparative Example

A comparative multilayer printed wiring board was produced in the same manner as in Example 1 except that the S side roughness of a copper foil was 0.4 μm.

With the multilayer printed wiring boards produced in these Examples and Comparative Examples, a dc current was supplied to the wiring of the following construction and the temperature of each printed wiring board was measured by a thermocouple. The results are shown in terms of the differences from room temperature in the following Table 1.

Figure 5:
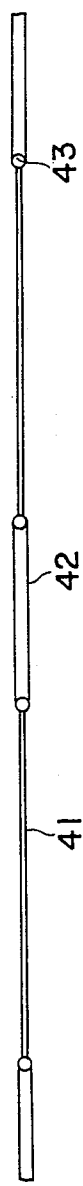
FIG. 5 is a schematic diagram for explaining the circuit construction used with examples and a comparative example.

Note that the circuit construction is as shown in FIG. 5 and the wiring dimensions are as follows.

First layer printed wiring pattern (41): width 0.5 mm, total length 60 mm.

Second layer printed wiring pattern (42): width 1 mm, total length 30 mm.

Through studs (43): 1 mm, four studs.

TABLE 1

| | PWB Temperature Rises | | |
| --- | --- | --- | --- |
| | Temperature rise due to current flow (°C.) | | Electric resistance |
| | 5 (A) | 10 (A) | (Ω) |
| example 1 | 14 | 55 | 0.17 |
| example 2 | 15 | 58 | 0.18 |
| example 3 | 14 | 57 | 0.19 |
| comparative example | 51 | Blowout | 0.18 |

With the foregoing examples, it is ascertained that the allowable current flowing through the printed wiring of the PWB can be increased in accordance with the present invention.

We claim:

1. A multilayer printed wiring board comprising:
   a metal core;
   a first insulating laminate disposed on said metal core;
   a first layer of printed wiring pattern laminated to said first insulating laminate, said first layer of printed wiring pattern comprising a metal layer whose one surface on the side away from said first insulating laminate is roughened in a manner that an average value of the differences in height between peaks and valleys thereof is 1μ mm or more,
   a second layer of printed wiring pattern made of a cured conductive paste;
   a second insulating laminate disposed to electrically insulate said first and second layers of printed wiring patterns from each other; and
   a plurality of through studs forming conducting paths between said first layer of printed wiring pattern and said second layer of printed wiring pattern, said through studs being made of a cured conductive paste,
   whereby said multilayer printed wiring board has excellent heat dissipating properties.

2. A multilayer printed wiring board according to claim 1, wherein said metal core comprises an aluminum plate.

3. A multilayer printed wiring board according to claim 1, wherein said metal core comprises an aluminum plate having an oxide coating on a surface thereof.

4. A multilayer printed wiring board according to claim 1, wherein said insulating laminate disposed on said metal core is a composite material comprising mainly a resin and an inorganic material.

5. A multilayer printed wiring board according to claim 1, wherein said first insulating laminate disposed on said metal core is a laminate comprising a plurality of different composite materials, each comprising mainly a resin and an inorganic material.

6. A multilayer printed wiring board according to claim 4, wherein said resin is a material or mixture of two or more materials selected from the group consisting of epoxy, phenol, polyamide-imide, polyimide, nitrile-rubber modified phenol, and butyral modified phenol resins.

7. A multilayer printed wiring board according to claim 4, wherein said inorganic material is a material or mixture of two or more materials selected from the group consisting of glass cloth and powdered talc, quartz, alumina and titania.

8. A multilayer printed wiring board according to claim 1, wherein the metal surface of said first layer of printed wiring pattern away from said first insulation laminate is a roughened surface whose average value of the differences in height between peaks and valleys thereof is between 2 and 6 μm.

9. A Multilayer printed wiring board according to claim 1, wherein the roughened surface of said first layer of printed wiring pattern is formed by an electrochemical deposition process.

10. A multilayer printed wiring board according to claim 1, wherein said first layer of printed wiring pattern comprises a metal foil bonded to said metal core through said first insulating laminate.

11. A multilayer printed wiring board according to claim 10, wherein said metal foil is a copper foil.

12. A multilayer printed wiring board according to claim 1, wherein said second insulating laminate for electrically insulating said first and second layers of printed wiring patterns from each other is a composite material comprising mainly a resin and an inorganic material.

13. A multilayer printed wiring board according to claim 1, wherein said second insulating laminate is a laminate comprising a plurality of different composite materials, each comprising mainly a resin and an inorganic material.

14. A multilayer printed wiring board according to claim 12, wherein said resin is a material or mixture of two or more materials selected from the group consisting of epoxy, phenol, polyamide-imide, polyimide, nitrile-rubber modified phenol, butyral modified phenol and acrylic resins.

15. A multilayer printed wiring board according to claim 12, wherein said inorganic material is a material or mixture of two or more materials selected from the group consisting of powdered talc, clay, barium sulfate, calcium carbonate, quartz, silica, alumina and titania.

16. A multilayer printed wiring board according to claim 1, wherein said conductive paste comprises a resin-type copper paste containing spherical copper powder as a conductive filler.

17. A multilayer printed wiring board according to claim 16, wherein said copper powder has holes therein.

18. A multilayer printed wiring board according to claim 1, wherein a metal layer is formed by electroless plating on a part or whole of the surface of said second layer of printed wiring pattern.

19. A multilayer printed wiring board according to claim 18, wherein said plated metal layer comprises nickel-boron alloy electrodeless plating and copper electrodeless plating.

* * * * *